United States Patent
Kim et al.

(10) Patent No.: US 8,609,543 B2
(45) Date of Patent: Dec. 17, 2013

(54) METHOD FOR MANUFACTURING SEMICONDUCTOR DEVICE HAVING MULTI-LAYERED HARD MASK LAYER

(75) Inventors: Myung-Ok Kim, Kyoungki-do (KR); Tae-Woo Jung, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 716 days.

(21) Appl. No.: 12/005,439

(22) Filed: Dec. 26, 2007

(65) Prior Publication Data
US 2008/0160774 A1 Jul. 3, 2008

(30) Foreign Application Priority Data
Dec. 27, 2006 (KR) ................. 10-2006-0134252

(51) Int. Cl.
*H01L 21/311* (2006.01)
(52) U.S. Cl.
USPC .............. 438/703; 438/700; 257/E21.038
(58) Field of Classification Search
USPC ........... 438/671, 700, 703; 257/E21.029, 257/E21.038
See application file for complete search history.

(56) References Cited

U.S. PATENT DOCUMENTS

| | | | | |
|---|---|---|---|---|
| 6,143,474 | A * | 11/2000 | Shen et al. ................. | 430/313 |
| 6,701,941 | B1 * | 3/2004 | Bergman et al. ............. | 134/25.4 |
| 2001/0034135 | A1 * | 10/2001 | Miyakawa ................... | 438/710 |
| 2004/0067658 | A1 * | 4/2004 | Ko et al. .................... | 438/778 |
| 2004/0127037 | A1 * | 7/2004 | Lee ........................... | 438/689 |
| 2004/0145020 | A1 * | 7/2004 | Kang et al. ................. | 257/350 |
| 2005/0245015 | A1 * | 11/2005 | Ohuchi ...................... | 438/197 |
| 2006/0046494 | A1 * | 3/2006 | Nam .......................... | 438/706 |
| 2006/0257791 | A1 * | 11/2006 | Kim et al. .................. | 430/313 |
| 2007/0004140 | A1 * | 1/2007 | Jang et al. ................. | 438/257 |
| 2007/0082296 | A1 * | 4/2007 | Yang et al. ................. | 430/311 |

FOREIGN PATENT DOCUMENTS

| | | | |
|---|---|---|---|
| JP | 2002-261267 | | 9/2002 |
| JP | 2002261267 | * | 9/2002 |
| KR | 1020040051229 | * | 6/2004 |
| KR | 1020040051229 | | 6/2009 |

* cited by examiner

*Primary Examiner* — Kimberly Rizkallah
*Assistant Examiner* — Duy T Nguyen
(74) *Attorney, Agent, or Firm* — Blakely Sokoloff Taylor & Zafman

(57) ABSTRACT

A method for fabricating a semiconductor device includes providing a substrate having a first and a second region, forming an etch target layer over the substrate, forming a hard mask layer over the etch target layer to have different thicknesses over the first and the second regions, forming a hard mask pattern by etching the hard mask layer, and etching the etch target layer using the hard mask pattern as an etch mask to form a target pattern having different densities over the first and the second regions.

19 Claims, 7 Drawing Sheets

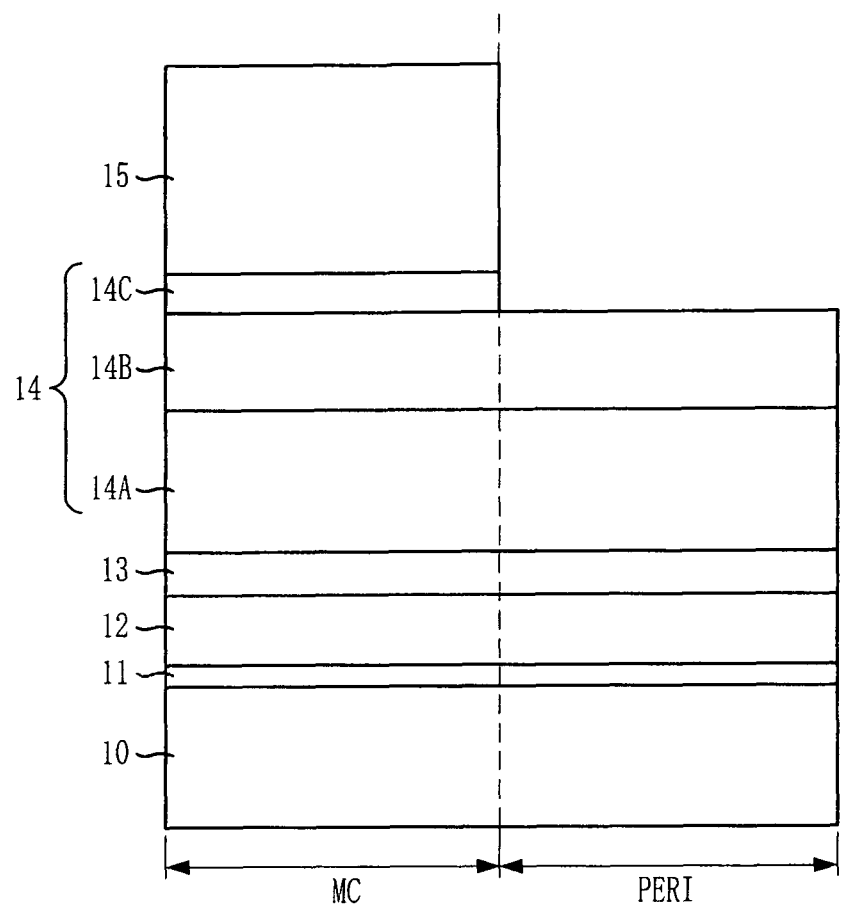

METHOD FOR MANUFACTURING SEMICONDUCTOR DEVICE HAVING MULTI-LAYERED HARD MASK LAYER

CROSS-REFERENCE TO RELATED APPLICATIONS

The present invention claims priority of Korean patent application number 2006-0134252, filed on Dec. 27, 2006, which is incorporated by reference in its entirety.

BACKGROUND OF THE INVENTION

The present invention relates to a method for fabricating a semiconductor device, and more particularly, to an etching method employing a hard mask scheme in regions having different pattern densities.

Large-scale integration trends have brought about a reduction of a critical dimension (CD) of a gate, and the reduction of the CD is required not only in a memory cell region but also in a peripheral region.

A typical method for forming a gate in a semiconductor memory device employs a hard mask scheme to etch the gate. According to the hard mask scheme, there is formed a hard mask having substantially the same pattern as a photoresist pattern below the photoresist pattern to compensate limitations of the photoresist pattern that is independently used as an etch mask. Then, the photoresist pattern is removed and the hard mask is only used as an etch mask to the etch.

In a process of forming the gate according to the typical method, a hard mask in the memory cell region is formed to have a thickness substantially the same as that in the peripheral region or each region has a stack structure of layers having substantially the same thickness as that in the other region.

However, in the typical method, there is an increased etch rate in the peripheral region having a lower pattern density than the memory cell region because of a loading effect due to a difference of the pattern densities between the memory cell region and the peripheral region. Also, undue polymers are accumulated in the peripheral region compared to the memory cell region. Accordingly, a slope generated during the gate etch process in the peripheral region is steeper than that in the memory cell region and, thus, the reduction of the CD of the gate in the memory cell is less than that in the peripheral region. As a result, a difference of the CDs between the memory cell region and the peripheral region increases.

SUMMARY OF THE INVENTION

Embodiments of the present invention are directed to provide a method for fabricating a semiconductor device. The method prevents an increase of a gate CD difference between a memory cell region having a high pattern density and a peripheral region having a low pattern density.

In accordance with an aspect of the present invention, there is provided a method for fabricating a semiconductor device. The method includes providing a substrate having a first and a second region, forming an etch target layer over the substrate, forming a hard mask layer over the etch target layer to have different thicknesses over the first and the second regions, forming a hard mask pattern by etching the hard mask layer, and etching the etch target layer using the hard mask pattern as an etch mask to form a target pattern having different densities over the first and the second regions.

BRIEF DESCRIPTION OF THE DRAWINGS

FIGS. 1A to 1I are cross-sectional views of a method for fabricating a semiconductor device.

DESCRIPTION OF SPECIFIC EMBODIMENTS

Figure 1A:
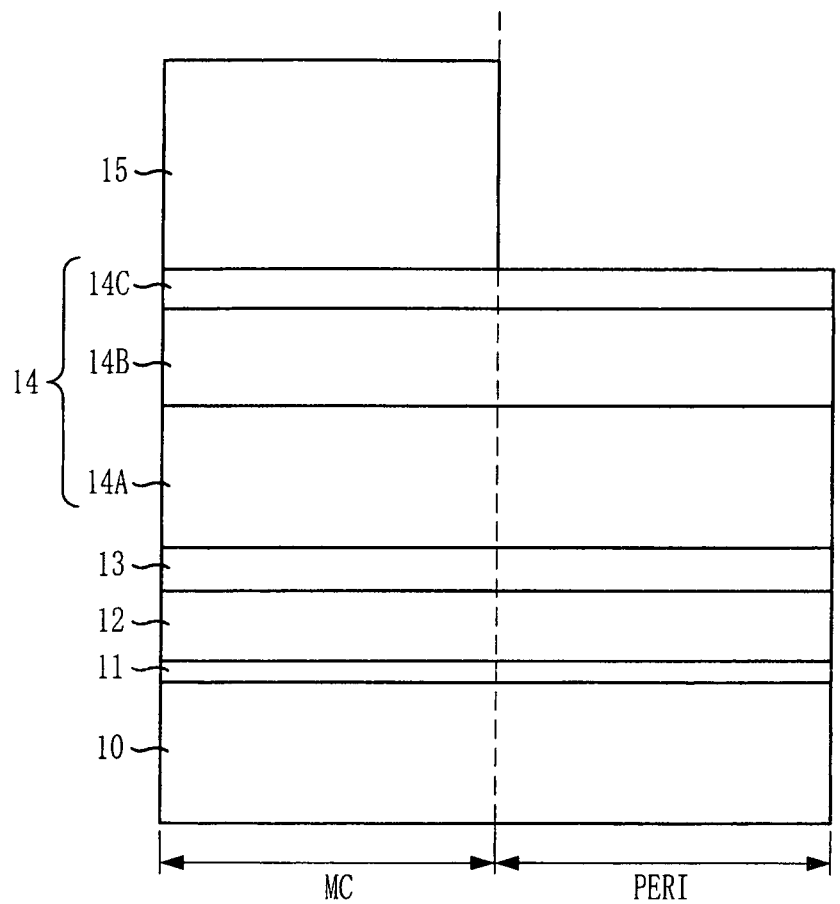

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals throughout the various embodiments of the present invention represent the same or like elements in different drawings.

FIGS. 1A to 1I are cross-sectional views of a method for fabricating a semiconductor device.

Referring to FIG. 1A, there is provided a substrate 10 divided into a memory cell region MC and a peripheral region PERI. A plurality of memory cells are formed in the memory cell region MC. A driving circuit including a plurality of transistors to drive the memory cells is formed in the peripheral region PERI. The substrate 10 may be a silicon on insulator (SOI) substrate or an inexpensive bulk substrate.

A gate insulation layer 11 is formed over the substrate 10. The gate insulation layer 11 may include a silicon oxide ($SiO_2$) layer or a stacked structure of the $SiO_2$ layer and a nitride layer. The gate insulation layer 11 may include a metal oxide layer having a higher permittivity than the $SiO_2$ layer, e.g., a hafnium oxide ($HfO_2$) layer, a zirconium oxide ($ZrO_2$) layer, or an aluminum oxide ($Al_2O_3$) layer. For instance, one of a wet oxidation process, a dry oxidation process, and a radical oxidation process is used to form the gate insulation layer 11 including the $SiO_2$ layer.

A polysilicon layer 12 is formed as a conductive layer for a gate electrode over the gate insulation layer 11. The polysilicon layer 12 may be doped or undoped with impurity ions.

A conductive layer 13 is formed over the polysilicon layer 12 to lower a resistivity of the gate electrode. The conductive layer 13 may include one selected from a group consisting of a transition metal, a rare earth metal, and an alloy thereof. Otherwise, the conductive layer 13 may have a stack structure of the above metals. For instance, the conductive layer 13 may include one selected from a group consisting of cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), nickel (Ni), titanium (Ti), cobalt (Co), copper (Cu), platinum (Pt), aluminum (Al), tungsten (W), chromium (Cr), molybdenum (Mo), gold (Au), silver (Ag), zinc (Zn), iridium (Ir), triazole (Ta), hydrogen fluoride (Hf), potassium (K), lithium (Li), cesium (Cs) layers and a combination thereof, or a stack structure of the above metals. Besides, the conductive layer 13 may include an oxide material, a nitride material, or a silicide.

A hard mask layer 14 for the gate electrode is formed over the conductive layer 13. Hereinafter, the hard mask layer 14 for the gate electrode is called a gate hard mask layer. The gate hard mask layer 14 has a stack structure of a nitride layer 14A, an amorphous carbon layer 14B, and a silicon oxy-nitride (SiON) layer 14C. Instead of the SiON layer 14C, one of a W layer, a tungsten silicide (Wsix) layer, an aluminum oxide layer ($Al_2O_3$) layer, a polysilicon layer, and an oxide layer can be used.

A photoresist pattern 15 is formed by coating a photoresist layer over the gate hard mask layer 14 and performing a photo-exposure and a development process using a photo mask. The photoresist pattern 15 includes the photoresist layer remaining in the memory cell region MC and removed in the peripheral region PERI.

Referring to FIG. 1B, a portion of the SiON layer 14C formed in the peripheral region PERI is removed by an etch process using the photoresist pattern 15 as an etch mask. It is preferable to perform the etch process on condition that an etch selectivity ratio of the SiON layer 14C to the amorphous carbon layer is high to use the amorphous carbon layer 14B formed below the SiON layer 14C as an etch stop layer, so that the loss of the amorphous carbon layer 14B in the peripheral region PERI becomes less than approximately 50 Å. The etch process is performed using a gas mixture of a chlorine ($Cl_2$) gas, a fluoroform ($CHF_3$) gas, and an Ar gas and an internal pressure of an etch chamber ranging from approximately 5 mTorr to approximately 30 mTorr. During the etch process, a source power applied through an upper electrode over a wafer is controlled in a range of approximately 300 W to approximately 900 W. A bias power, i.e., an auxiliary-power, applied through a lower electrode below the wafer is controlled in a range of approximately 0 W to approximately 300 W.

Figure 1C:
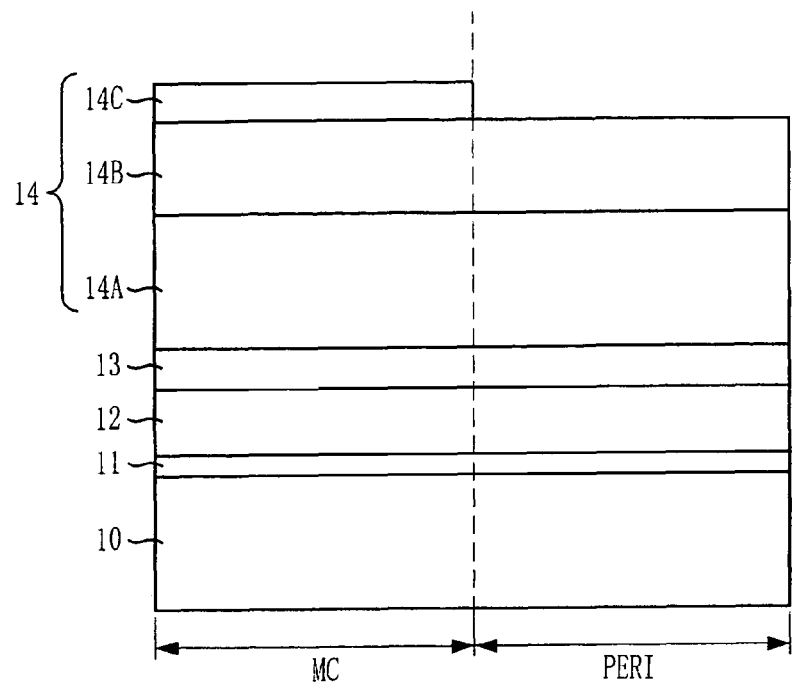

Referring to FIG. 1C, the photoresist pattern 15 is removed. It is desirable that the removal of the photoresist pattern 15 is performed using a material having a high etch selectivity to the amorphous carbon layer 14B so that the photoresist pattern 15 is only removed without damaging the amorphous carbon layer 14B in the peripheral region PERI. For instance, in the removal process, a portion of the photoresist pattern 15 is removed using thinner and the remaining portion of the photoresist pattern 15 is completely removed by a wet etch process using a deionized (DI) water and an ozone ($O_3$) gas.

Figure 1D:
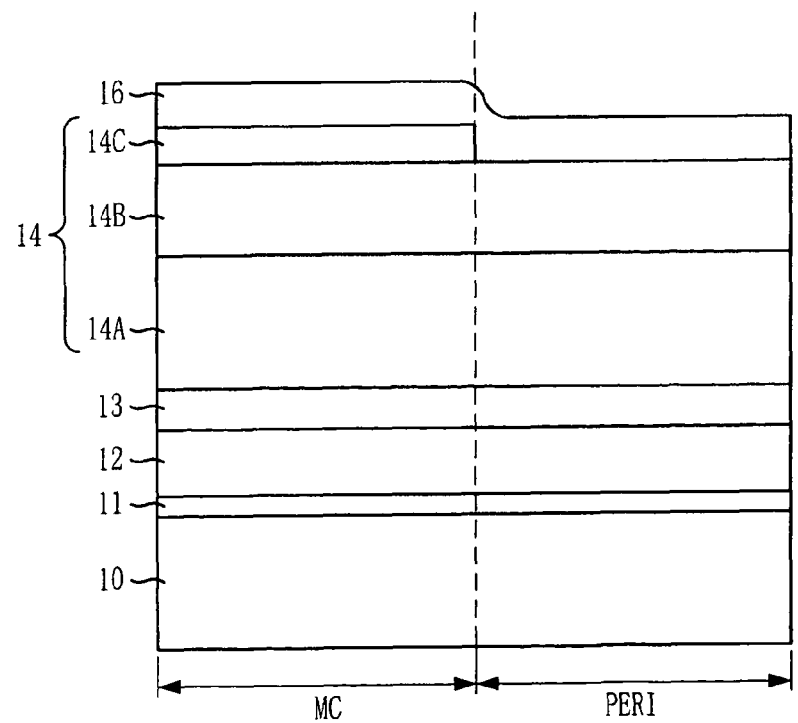

Referring to FIG. 1D, a second SiON layer 16 is formed along a height difference over the substrate 10 which includes the SiON layer 14C (refining to a first SiON layer) remaining only in the memory cell region MC. Herein, since the first SiON layer 14C is left only in the memory cell region MC, the height difference is generated between the memory cell region MC and the peripheral region PERI. Therefore, this height difference still remains between the memory cell region MC and the peripheral region PERI after the second SiON layer 16 is deposited.

Figure 1E:
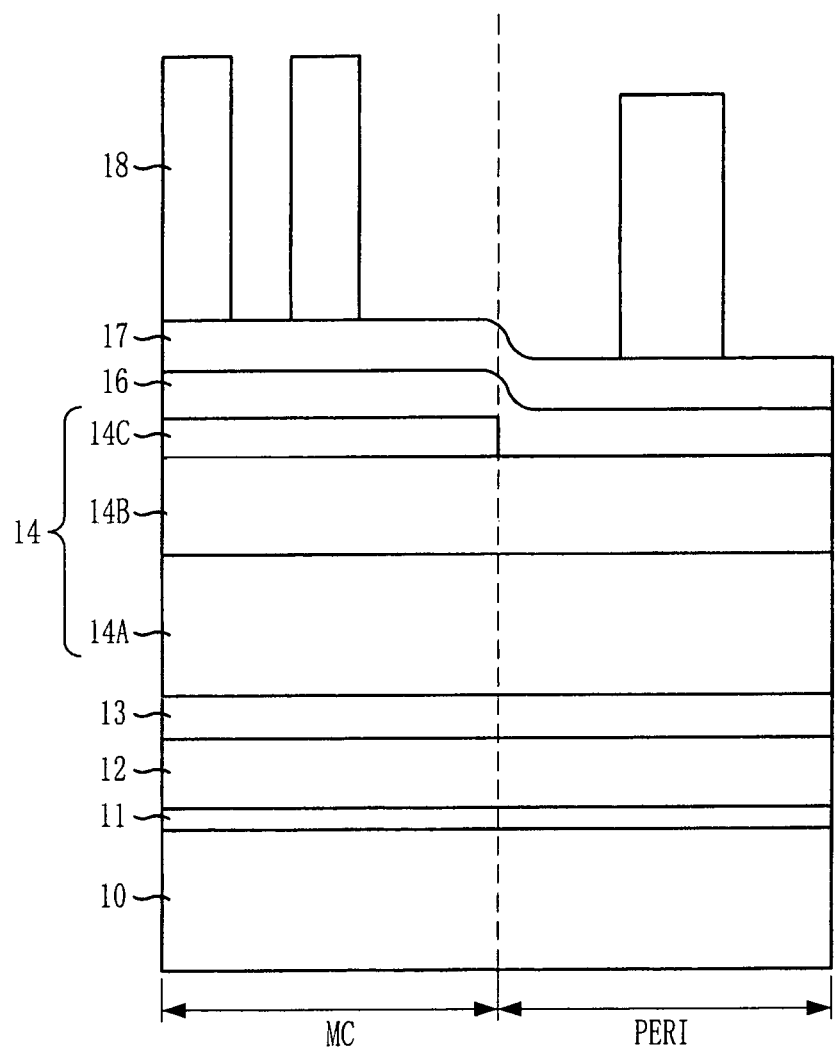

Referring to FIG. 1E, a bottom anti-reflection coating (BARC) layer 17 is formed along the height difference over the substrate 10 including the second SiON layer 16. It is preferable to form the BARC layer 17 with an organic material that can avoid an interference phenomenon for an argon fluoride (ArF) light source. The organic material includes a hardener for helping the BARC layer 17 to have a cross-linking structure, a light absorbent absorbing light in a wavelength range of the light source, an organic solvent and a thermal acid generator for activating the cross-linking reaction.

Then, a photoresist pattern 18 is formed over the BARC layer 17.

Figure 1F:
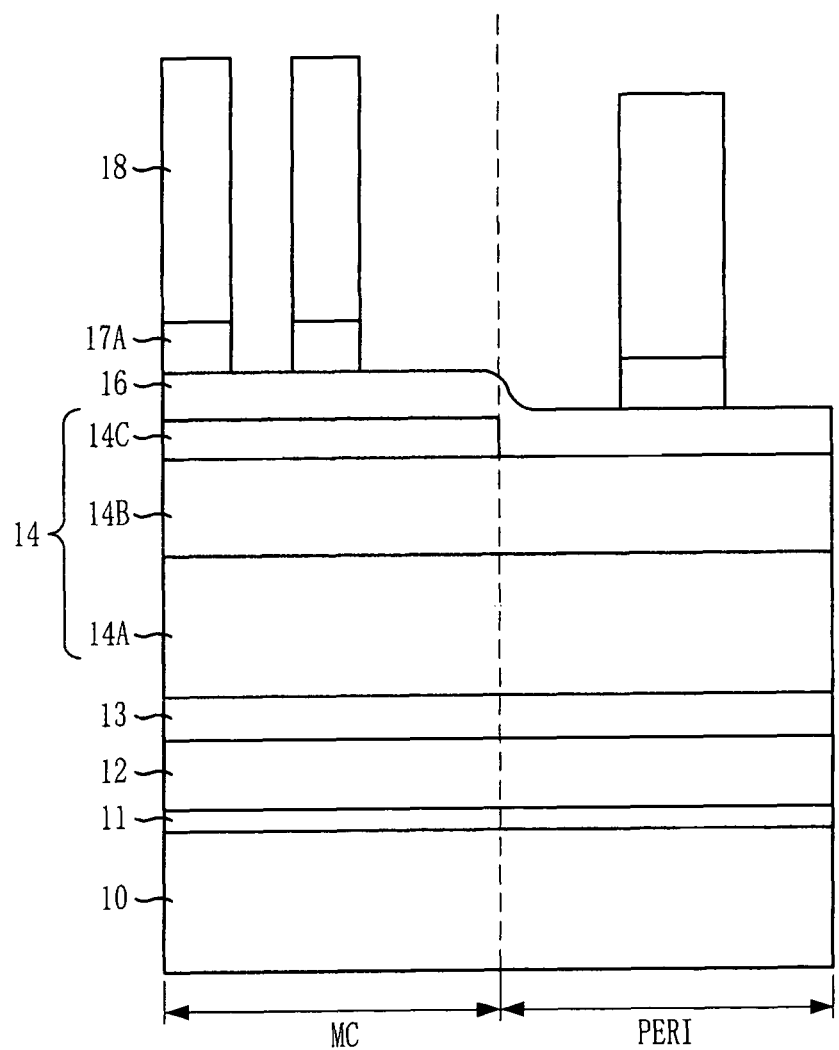

Referring to FIG. 1F, the BARC layer 17 is etched using the photoresist pattern 18 as an etch mask. Hereinafter, the etched BARC layer 17 is called a BARC pattern 17A. This etch process is performed when the memory cell region MC and the peripheral region PERI have the same gate CD bias, wherein the CD bias represents a variation of a develop inspection CD (DICD) to a final inspection critical dimension (FICD). The etch process is performed with a wet etch using a pressure higher than approximately 100 mTorr, preferably in a range of approximately 100 mTorr to approximately 10 Torr, a source power lower than approximately 500 W, desirably in a range of approximately 100 W to approximately 500 W, and a bias power ranging from approximately 0 W to approximately 100 W, so that the gate CD bias in the peripheral region PERI is greater than that in the memory cell region MC.

Figure 1G:
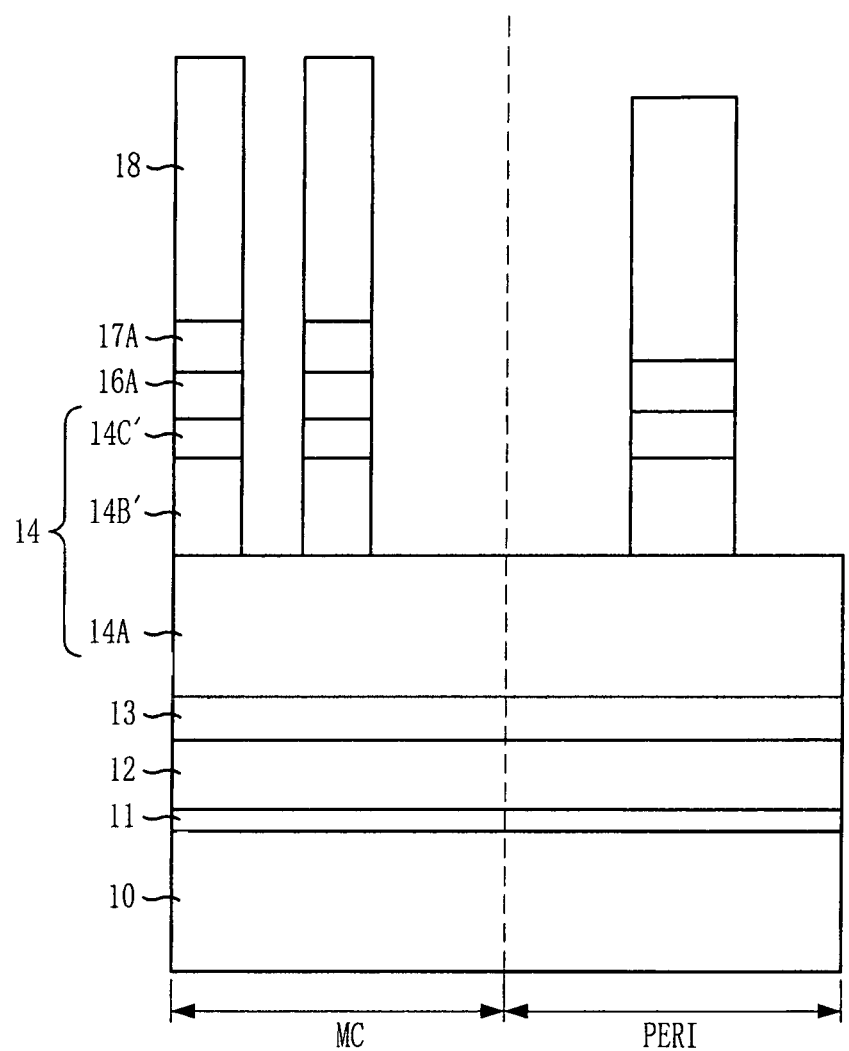

Referring to FIG. 1G, through an etch process in which the photoresist pattern 18 is used as an etch mask, the second SiON layer 16 and the first SiON layer 14C that does not exist in the peripheral region PERI, as well as the amorphous carbon layer 14B are etched. Hereinafter, the etched second SiON layer 16 is called a second SiON pattern 16A. The etched first SiON layer 14C is called a first SiON pattern 14C'. The etched amorphous carbon layer 14B is called an amorphous carbon pattern 14B'.

Figure 1H:
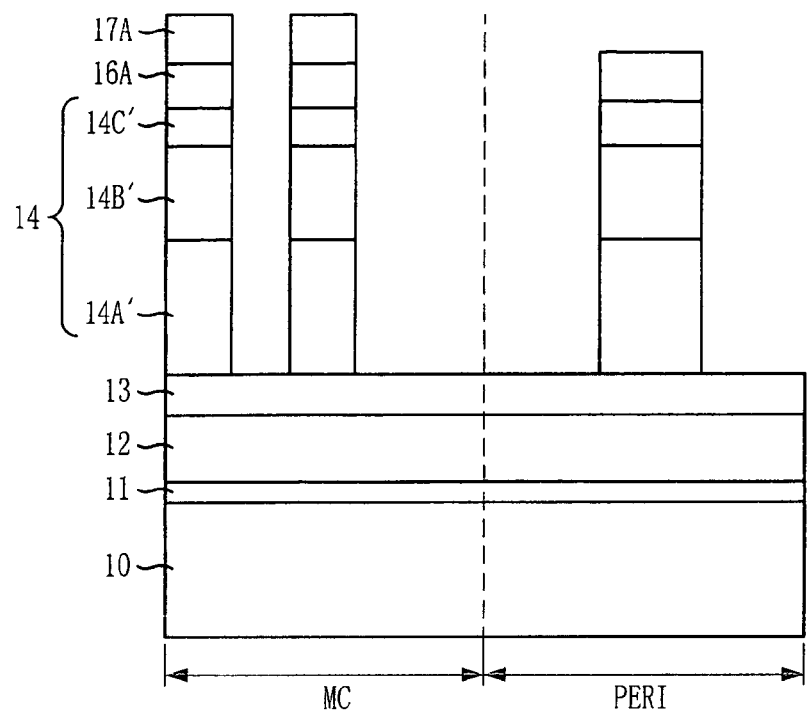

Referring to FIG. 1H, the photoresist pattern 18 is removed. At this time, the BARC pattern 17A can be removed together. The nitride layer 14A is etched using the second SiON pattern 16A, the first SiON pattern 14C', and the amorphous carbon pattern 14B' as an etch mask. The etch processes performed in FIGS. 1F and 1H are desirably performed by in-situ process, using a plasma etcher such as an inductively coupled plasma (ICP) apparatus or a capacitance coupled plasma (CCP) apparatus.

For instance, it is required that the loss of the conductive layer 13 and the gate CD bias in the memory cell region MC maintains substantially the same as that in the peripheral region PERI when etching the nitride layer 14A. Therefore, the etch process uses a gas mixture including a tetrafluoromethane ($CF_4$) gas, a $CHF_3$ gas, and an $O_2$ gas, a high pressure greater than approximately 100 mTorr, preferably ranging from approximately 100 mTorr to approximately 10 Torr, a source power lower than approximately 500 W, desirably ranging from approximately 100 W to approximately 500 W, and a bias power over approximately 700 W, desirably ranging from approximately 700 W to approximately 1,000 W.

Figure 1I:
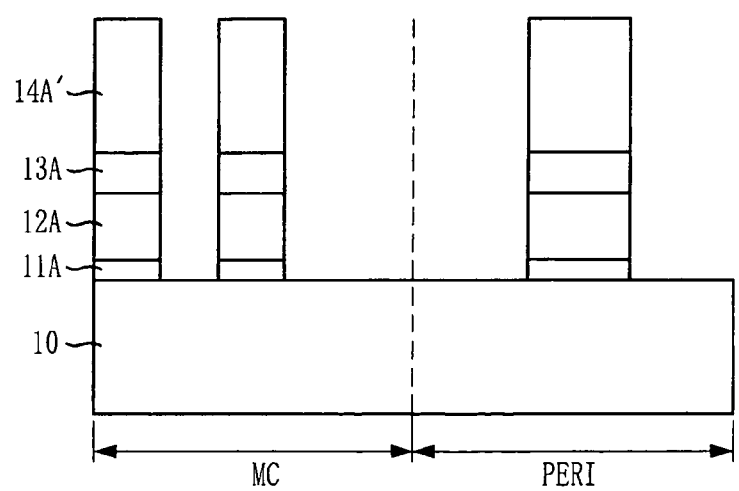

Referring to FIG. 1I, the second SiON pattern 16A, the first SiON pattern 14C' and the amorphous carbon pattern 14B' are removed.

The conductive layer 13, the polysilicon layer 12, and the gate insulation layer 11 are sequentially etched using the nitride pattern 14A' as an etch mask to form a gate electrode. Hereinafter, the etched conductive layer 13 is called a conductive pattern 13A. The etched polysilicon layer 12 is called a polysilicon pattern 12A. The etched gate insulation layer 11 is called a gate insulation pattern 11A. Meanwhile, a part of an upper portion of the polysilicon layer 12 and the conductive layer 13 are etched using the nitride pattern 14A' as an etch mask and a material for a spacer is deposited thereon. Then, the material for a spacer and the remaining polysilicon layer 12 are etched to form the gate electrode. At this time, the spacer includes a nitride layer and an oxide layer.

As described, in accordance with the present invention, during the etch process, the hard mask layer is formed to have different thicknesses in a region having a high pattern density and a region having a low pattern density. Thus, a pattern CD bias of the region having the low pattern density increases. That is, the process increases the reduction range of the CD in a pattern of an etch target layer to be formed finally.

In the above embodiment, although the gate electrode is illustrated as the etch target layer, the present invention can be applied to any process of etching an etch target layer formed over regions having different pattern densities from each other.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
   providing a substrate having a first region and a second region;
   forming an etch target layer over the first and the second regions of the substrate simultaneously;
   forming a hard mask layer over the etch target layer to have different thicknesses over the first and the second regions, wherein the hard mask layer is composed of at least three or more layers and at least one set of the top two layers is composed of the same material;
   forming a hard mask pattern by etching the hard mask layer; and
   simultaneously etching the etch target layer over the first and the second regions using the hard mask pattern as an etch mask to form a target pattern having different densities over the first and the second regions,
   wherein the hard mask layer has a greater thickness over the first region than over the second region,
   wherein the first region is a cell region and the second region is a peripheral region,
   wherein the cell region has a higher pattern density compared to the peripheral region.

2. The method of claim 1, wherein the target pattern over the first region has the higher pattern density compared to the target pattern over the second region.

3. The method of claim 1, wherein the hard mask layer includes a stack structure of layers.

4. The method of claim 1, wherein the hard mask layer has a stack structure of layers including an amorphous layer.

5. The method of claim 1, wherein forming the hard mask layer comprises:
   forming a first layer over the etch target layer;
   forming a second layer over the first layer;
   forming a third layer over the second layer;
   removing a portion of the third layer formed over the second region to form a resultant structure; and
   forming a fourth layer along a surface of the resultant structure.

6. The method of claim 5, wherein the first layer includes a nitride layer, the second layer includes an amorphous carbon layer, and the third and the fourth layers include a silicon oxy-nitride (SiON) layer.

7. The method of claim 6, wherein forming the hard mask pattern comprises:
   forming an anti-reflection coating layer over the hard mask layer;
   forming an anti-reflection coating pattern by etching the anti-reflection coating layer; and
   etching the hard mask layer using the anti-reflection coating pattern as an etch mask.

8. The method of claim 7, wherein etching the hard mask layer is performed by using an inductively coupled plasma (ICP) apparatus or a capacitively coupled plasma (CCP) apparatus.

9. The method of claim 7, wherein etching the hard mask layer is performed by an in-situ process.

10. The method of claim 7, wherein etching the hard mask layer uses a gas mixture including a $CF_4$ gas, a $CHF_3$ gas, and an $O_2$ gas, and a pressure ranging from approximately 100 mTorr to approximately 10 Torr, a source power ranging from approximately 100 W to approximately 500 W, and a bias power ranging from approximately 700 W to approximately 1,000 W during etching the first layer of the hard mask layer.

11. The method of claim 7, forming the anti-reflection coating pattern uses a pressure ranging from approximately 100 mTorr to approximately 10 Torr, a source power ranging from approximately 100 W to approximately 500 W, and a bias power ranging from approximately 1 W to approximately 100 W.

12. The method of claim 7, wherein forming the target pattern is performed using the first layer of the hard mask layer as an etch mask.

13. The method of claim 6, wherein removing the portion of the third layer comprises:
    forming a photoresist pattern on the third layer to expose the portion of the third layer over the second region; and
    etching the exposed portion of the third layer using the photoresist pattern as an etch mask.

14. The method of claim 13, wherein etching the portion of the third layer further comprises removing the photoresist pattern.

15. The method of claim 14, wherein removing the photoresist pattern comprises:
    removing a portion of the photoresist pattern using a thinner; and removing the remaining portion of the photoresist pattern using a deionized (DI) water and an ozone ($O_3$) gas.

16. The method of claim 13, wherein etching the portion of the third layer is performed by using a gas mixture including a chlorine ($Cl_2$) gas, a fluoroform ($CHF_3$) gas, and an argon (Ar) gas, a pressure ranging from approximately 5 MTorr to approximately 30 MTorr and a source power ranging from approximately 300 W to approximately 900 W.

17. The method of claim 16, wherein etching the portion of the third layer is performed by using a bias power ranging from approximately 1 W to approximately 300 W.

18. The method of claim 5, wherein the third layer formed over the second region is etched until an upper surface of the second layer is exposed.

19. The method of claim 1, wherein the etch target layer has a stack structure of a polysilicon layer and a conductive layer.

* * * * *